United States Patent [19]

Stauffer

[11] Patent Number: 5,505,782

[45] Date of Patent: Apr. 9, 1996

[54] INTEGRATED DELIVERY SYSTEM FOR CHEMICAL VAPOR FROM NON-GASEOUS SOURCES FOR SEMICONDUCTOR PROCCESSING

[76] Inventor: Craig M. Stauffer, 3066 Scott Blvd., Santa Clara, Calif. 95054

[21] Appl. No.: 422,186

[22] Filed: Apr. 13, 1995

Related U.S. Application Data

[62] Division of Ser. No. 708,421, May 31, 1991, Pat. No. 5,252,134.

[51] Int. Cl.$^6$ .................................................. C23C 16/00
[52] U.S. Cl. ............................ 118/726; 118/715; 118/725
[58] Field of Search ...................................... 118/715, 725, 118/726

[56] References Cited

U.S. PATENT DOCUMENTS

| | | | |
|---|---|---|---|
| 4,436,674 | 3/1984 | McMenamin | 118/726 |
| 4,488,506 | 12/1984 | Heinecke | 118/726 |
| 4,545,801 | 10/1985 | Miyajiri | 118/726 |
| 4,572,943 | 2/1986 | Hogfeldt | 392/399 |
| 4,583,372 | 4/1986 | Egan | 62/53 |
| 4,619,844 | 10/1986 | Pierce | 118/726 |
| 4,640,221 | 2/1987 | Barbee | 118/715 |

*Primary Examiner*—Richard Bueker
*Attorney, Agent, or Firm*—Townsend and Townsend and Crew

[57] ABSTRACT

An integrated module with a heated reservoir to vaporize liquid for semiconductor processes with liquid sources is presented. Shut-off valves and a proportioning pressure valve for controlling the flow of the vapor from the reservoir are mounted on the module for simple conduction heating of the valves. A capacitance manometer also mounted to the module also has its own heating elements. Condensation of the vapor is avoided and consistence performance and reliability is obtained.

10 Claims, 8 Drawing Sheets

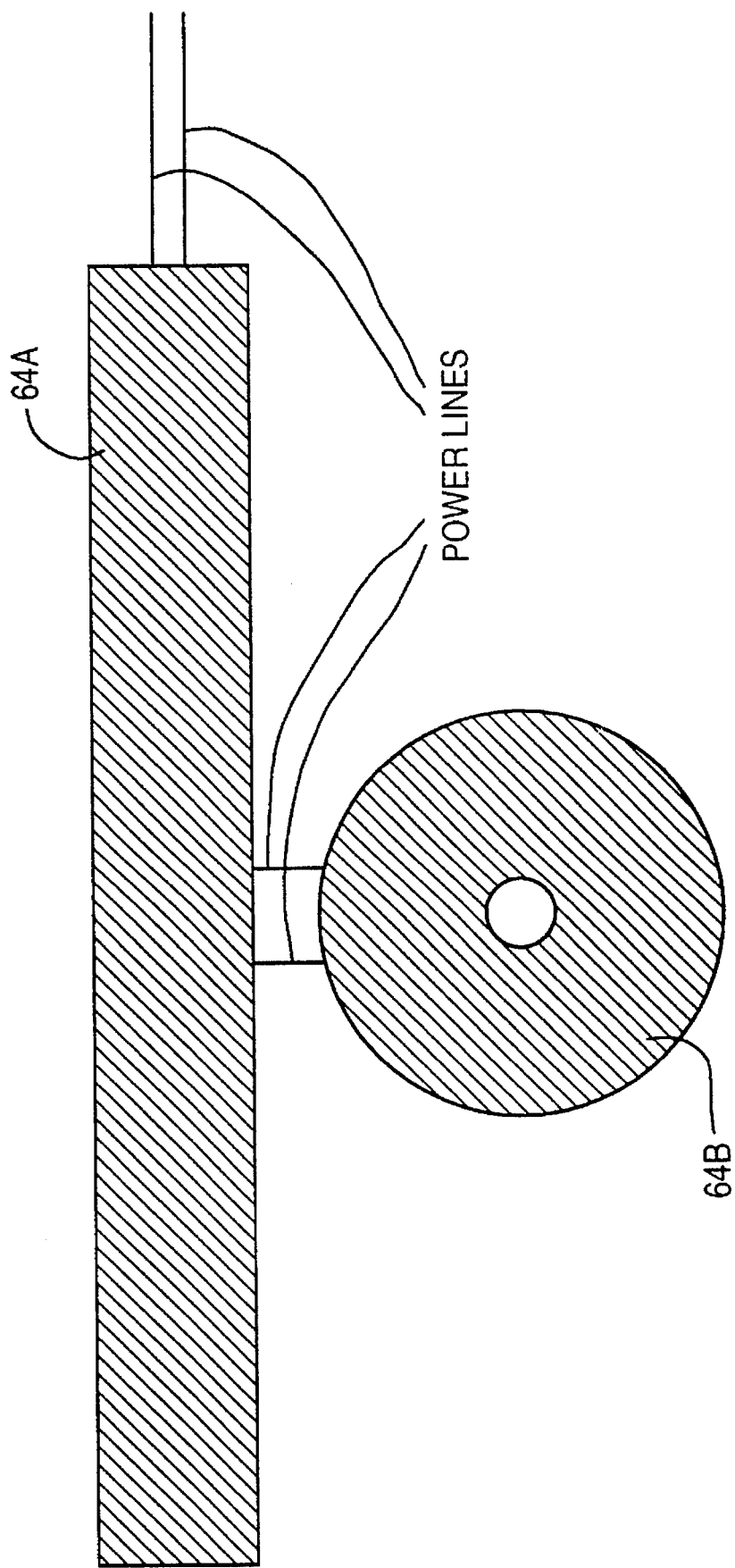

INTEGRATED DELIVERY SYSTEM FOR CHEMICAL VAPOR FROM NON-GASEOUS SOURCES FOR SEMICONDUCTOR PROCCESSING

This is a division of application Ser. No. 07/708,421 filed May 31, 1991 now U.S. Pat. No. 5,252,134.

BACKGROUND OF THE INVENTION

The present invention relates to semiconductor wafer processing equipment and, more particularly, to delivery systems for chemical vapors from liquid sources.

In the processing of semiconductor wafers, many processes require the delivery of gases into a processing chamber in which one or more semiconductor wafers are placed. Typically these gases at their sources are in the form of gases, such as nitrogen, oxygen, hydrogen, arsine, etc., in pressurized tanks. However, some processes use gases which are liquid at their sources. The liquid is heated to a vapor which is introduced into the processing chamber.

To create a chemical vapor from liquid sources, delivery systems for liquid sources heretofore have used a bubbler unit or a heated reservoir. In a bubbler unit a inert gas, such as nitrogen, is bubbled through the liquid source to carry the molecules of the chemical along with the inert gas. In heated reservoirs the liquid is heated to vaporize the source chemical for delivery.

In these systems other discrete units, such as valves, pressure and mass flow controllers, and the feedline through which the chemical vapor passes, are connected between the bubbler or reservoir unit and the processing chamber. Each of the discrete units may be heated. In any case, problems arise with these complicated delivery systems. Condensation forms at the unheated or inadequately heated points of the system. Reliability is poor and the consistency of performance is problematical.

Furthermore, the mass flow controllers of these systems have limited performance. These mass flow controllers are difficult to operate at temperatures above 70° C. because they use a heated bypass sensor to sense flow. This sensor has two sections. The first section has (electrical) resistance-heated walls to heat the gas. The second section is unheated and measures the temperature of heated gas from the first section. The difference in temperature of the gas entering the bypass and the gas leaving the bypass is measured to determine the rate of the gas flow. At gas temperatures of 70° C. and above, the difference in temperatures becomes so small that the rate of gas flow is difficult for these present day mass flow controllers to determine. Additionally, the second unheated section is a source of condensation problems.

The present invention solves or substantially mitigates many of these problems of delivering a chemical vapor to a processing chamber from a liquid source. The present invention is integrated and the problems of complexity of present day systems are avoided. Consistency of performance and reliability are greatly improved over present day systems. Furthermore, the present invention is adaptable to even solid sources.

SUMMARY OF THE INVENTION

The present invention provides for an integrated chemical vapor delivery system from a liquid source to a processing unit with a processing chamber therein for semiconductor wafers. The system has a housing with connections so that the housing can be mounted to the processing unit. A reservoir in the housing is connected to the source and to the processing chamber when the module housing is mounted to said processing unit. The reservoir holds the liquid from the source. The reservoir in the housing is heated by heating elements so that liquid in the reservoir is transformed into a vapor. A valve in the vapor flow from said reservoir to said processing chamber controls the delivery of the vapor.

Sensors for properties of the vapor flow from the reservoir to the processing chamber, such as pressure in the processing chamber or mass flow of the vapor from the reservoir to the processing chamber, provide a feedback control path for control of the vapor delivery.

The present invention also provides for a system for delivering chemical vapor effectively and efficiently from a liquid source for the processing of semiconductor wafers. The system has a processing unit and a vapor supply module. The processing unit has a housing defining a processing chamber for semiconductor wafers, a gas inlet, gas supply channels connected to the gas inlet for supplying gas to said processing chamber, and vacuum channels for removing gas from said processing chamber.

BRIEF DESCRIPTION OF THE DRAWINGS

A clear understanding of the present invention may be achieved by perusing the following detailed Description of Specific Embodiments with reference to the following drawings:

FIG. 3C is a flattened view of the heating elements for the manometer of FIG. 3A.

DETAILED DESCRIPTION OF SPECIFIC EMBODIMENTS

Figure 1:
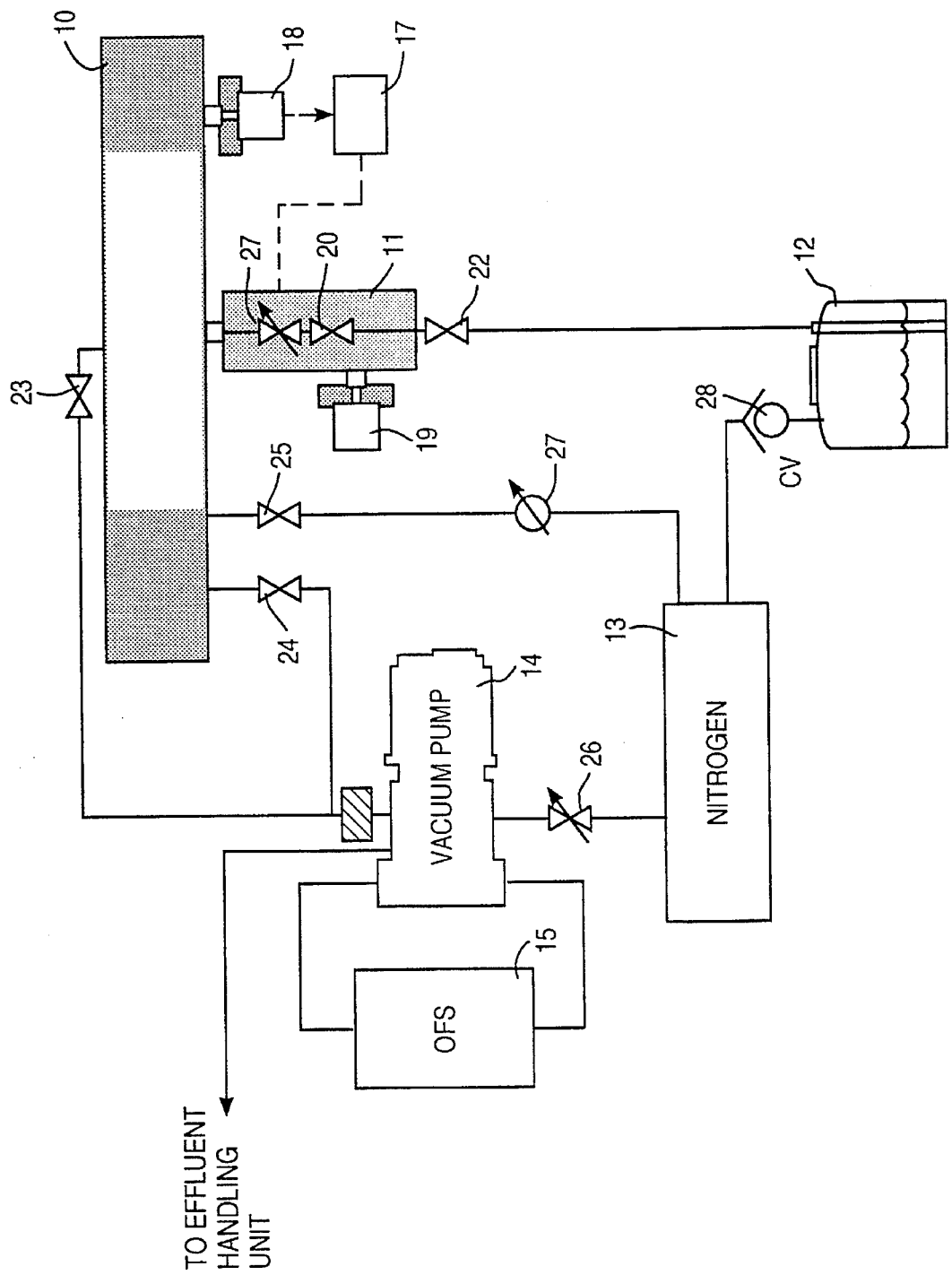
FIG. 1 is an overall schematic view of a chemical vapor delivery system according to the present invention.

FIG. 1 is an overall schematic illustration of a semiconductor processing system with one embodiment of a chemical vapor delivery system according to the present invention. In the FIG. 1 system, the chemical delivered is a silylation agent.

Silylation agents are one class of liquid sources in semiconductor processing. These agents are beginning to be used in advanced semiconductor processes requiring very high resolution. In semiconductor processing, after a layer of photoresist has been deposited on a semiconductor wafer and has been exposed to a pattern of light, the photoresist must be developed. With a silylation process in photoresist developing, the photoresist layer need only be exposed at the very top of the layer. This permits photolithography with light at short wavelengths and large numerical apertures without a large depth of focus. High resolution of features "imprinted" upon the semiconductor wafer during processing is ensured.

For silylation the agents must be heated and the resulting vapor supplied to the processing chamber at precise pressures and temperatures. As explained above, present day delivery systems for silylating agents are formed by a reservoir connected to a liquid source of the agents. The reservoir is heated and the vapor fed into the processing chamber by a feed line.

These systems are very difficult to maintain during operation. To avoid condensation of an agent, the feedline must be heated along with the various fittings between the process chamber and the reservoir. Nonetheless condensation remains a constant problem. Furthermore, the uneven heating at various points of the system leads to difficulties in delivering the silylating agent vapor to the processing chamber at precise temperatures and pressures.

To solve these problems for silylation agents, the FIG. 1 delivery system has an integrated chemical delivery module 11 which is attached to a processing unit 10 containing a processing chamber in which a semiconductor wafer is placed during processing. The module 11 supplies chemical vapor into the processing chamber from a supply 12 of chemicals in liquid form.

A vacuum pump 14 removes gas from the processing chamber through valves 23 and 24, which maintain a vacuum in the processing chamber. The vacuum pump 14 is also connected to an effluent handling unit (not shown) and an oil filtration system unit 15 for removing contaminants from the pump oil.

The nitrogen source 13 also supplies nitrogen for the processing chamber through a valve 25 and a flow meter 27. The valve 25 helps in the backfill of the processing chamber with $N_2$ when the processing chamber is raised from a vacuum to atmospheric pressure. The nitrogen source 13 is also connected to the pump 14 through a valve 26. The nitrogen to the pump 14 purges the pump oil to reduce the absorption of contaminants, such as silylating agents, into the oil. Finally the nitrogen source 13 is connected to the liquid source 12 to pressurize the source 12 to supply liquid to the module 11. A check valve 28 prevents backing of the liquid to the nitrogen source 13.

To monitor the pressure within the processing chamber, a capacitance manometer 18 is attached to the processing unit 10 and coupled to the processing chamber. The manometer 18 is coupled to an electronic control unit 17 which is connected to a proportioning pressure valve 20 in the module 11.

The module 11 has a reservoir which receives the chemical liquid from the liquid supply 12 through a liquid refill valve 22, a shut-off valve, which is integrally mounted to module 11. The reservoir is heated to change the liquid into a chemical vapor which then passes through a chamber feed valve 20, a shut-off valve, and the proportioning pressure valve 21. The two valves 21 and 22 are also integrally mounted to the module 11. Responsive to the signals from the unit 17, the valve 21 controls the pressure in the processing chamber by supplying more or less chemical vapor to the chamber. The module 11 also has a capacitance manometer 19 for accurately monitoring the pressure of the chemical vapor within the reservoir.

Figure 2A:
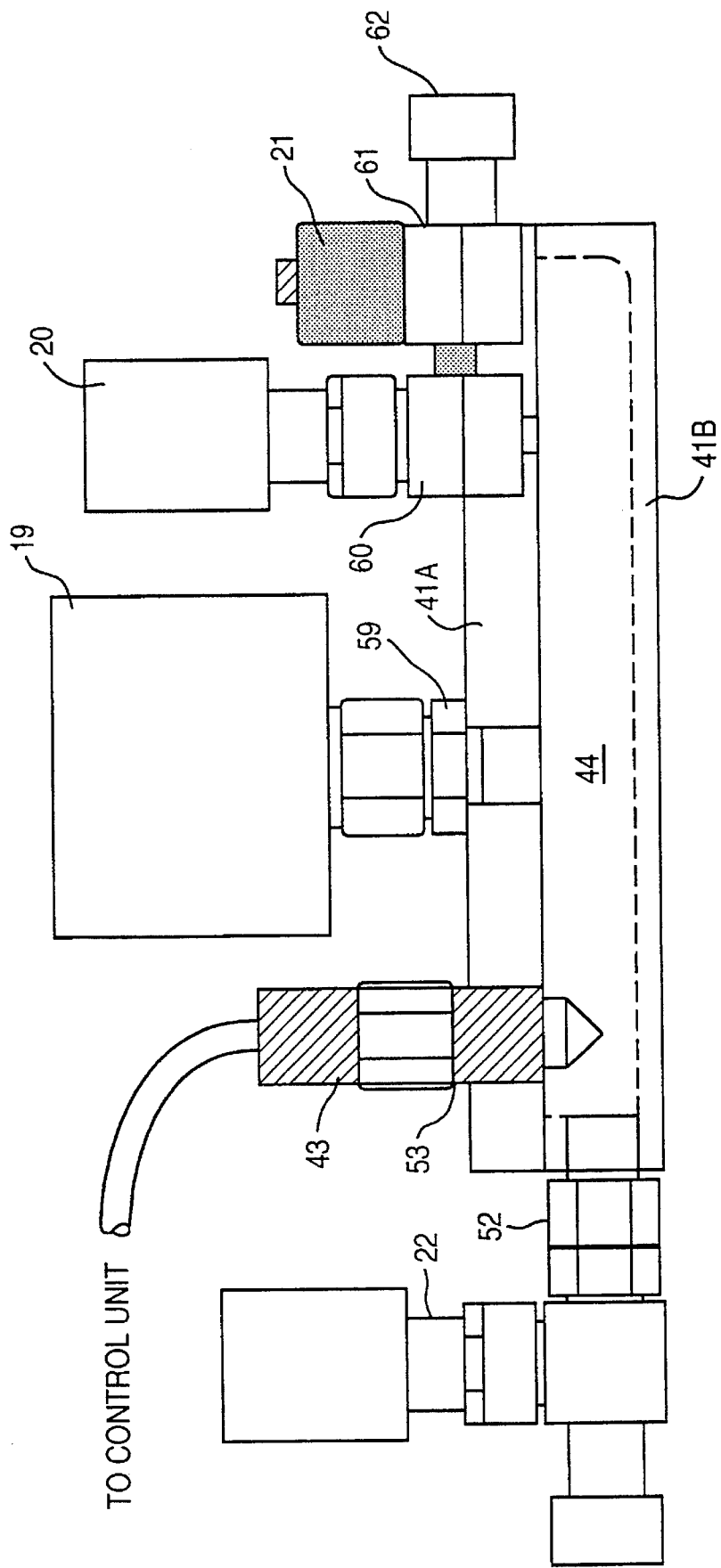
FIG. 2A is a cross-sectional side view of the integrated chemical vapor delivery module according to the present invention.
Figure 2B:
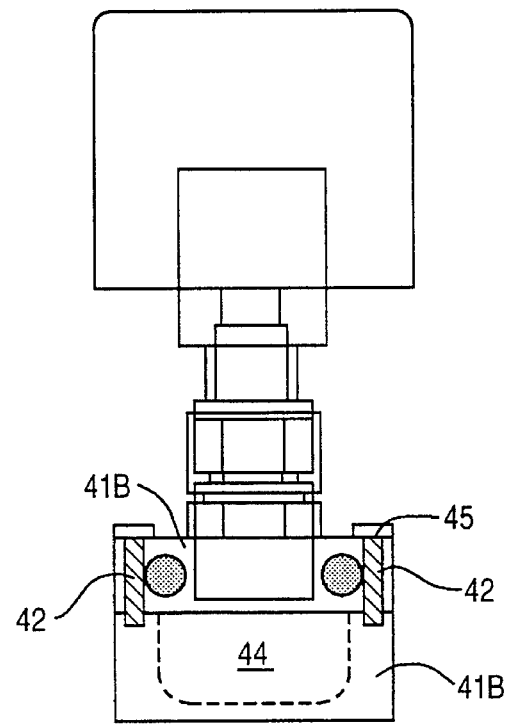
FIG. 2B is another cross-sectional side view of the module of FIG. 2A.

FIGS. 2A and 2B show the details of the structure of the module 11 more clearly. As shown in FIG. 2A, the module 11 has an upper housing unit 41A and a lower housing unit 41B, both of which are made from stainless steel. For operation, the units 41A and 41B are clamped together by bolts 45 shown in FIG. 2B.

In the lower housing unit 41B there is the liquid reservoir 44 outlined by a dotted line. Connected to the reservoir 44 is a vacuum fitting 52 mounted to the lower housing 41B. As an aside, it should be noted that all fittings are vacuum-tight to prevent leakage of liquid or vapor. The fitting 52 is connected to the liquid refill valve 22, Model 4V1P4K11ACSS, manufactured by Parker Hannafin of Huntsville, Ala., which is connected to the liquid source 12 by a refill line. The valve 22 is integral with the module 11 and forms a liquid supply channel with the fitting 52 and the refill line.

Mounted to the top housing 41A is the proportioning pressure valve 21, the chamber feed valve 20, the capacitance manometer 19, and the liquid level sensor 43. The sensor 43 is mounted to the housing 41A by a threaded (NPT) fitting 53. The sensor 43, Model 511S, manufactured by Genelco of Port Huron, Mich., determines the level of the liquid in the reservoir 44 so that the valve 22 can keep the reservoir 44 filled with liquid.

The manometer 19, Model 622B from Edwards High Vacuum of Wilmington, Mass., is attached to the housing unit 41A by a fitting 59, Model 8BVSS from Parker Hannafin of Huntsville, Ala., mounted to the unit 41A. The capacitance manometer 19 accurately measures the pressure of the vaporized liquid from the reservoir 44 as a check on the pressure.

The proportioning pressure valve 21, manufactured by PFD of San Jose, Calif., is a custom model with chemical resistant seals and a high temperature operating coil. The valve 21 is mounted to the housing 41A by a fitting 61 so that the valve 21 controls the passage of the vapor from the reservoir 44. The fitting 61 is also connected to a fitting 60 which is also mounted to the housing 41A. The fitting 60 holds the chamber feed valve 21, Model KIT2173 from Parker Hannafin, so that the passage of the vapor from the reservoir 44 can be turned off and on. The fitting 61 has an outlet 62 is directly connected to a gas inlet to the processing chamber of the processing unit 10 when the module 11 is mounted to the unit 10. The fittings 61 and 60 form a gas channel from the reservoir 44 to the inlet of the processing chamber.

Also mounted lengthwise in the top housing 41A are two resistance rod heaters 42, shown in cross-section in FIG. 2B. The rod heaters, manufactured by W. W. Grainger of Chicago, Ill., are inserted in one-quarter inch diameter holes drilled lengthwise in the housing 41A. With an electric current, the heaters 42 heat the units 41A and 41B and the liquid in the reservoir 44.

For additional heating to augment the thermal energy from the rods 42, piezoelectric transducers may also be mounted to the housing 41A, 41B. The sonic energy from the transducers, operating in a range of 600–1800 KHz, provide another source of heating to the reservoir 44 and the liquid and vapor in and from the reservoir 44.

Figure 3A:
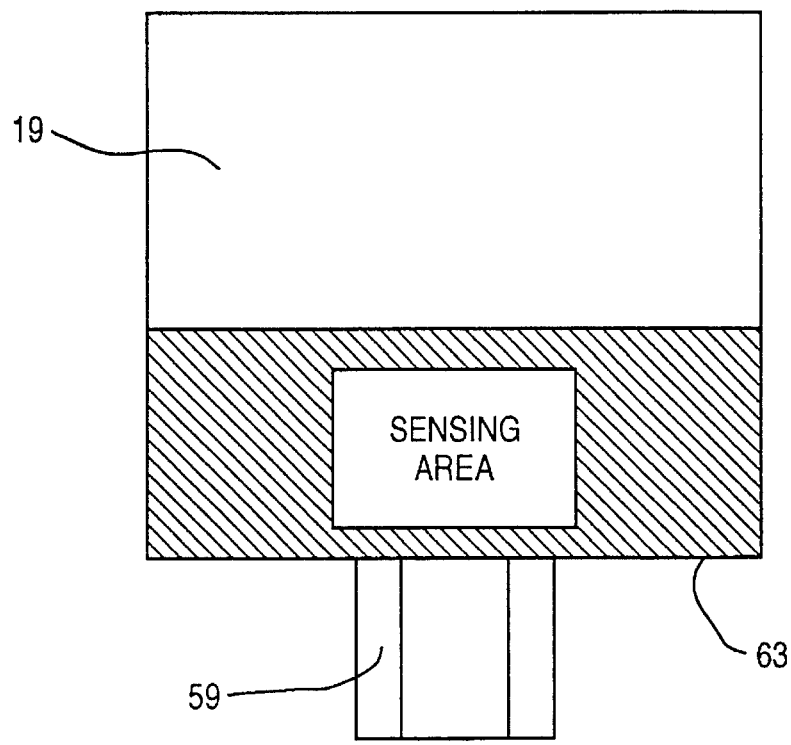
FIG. 3A is a schematic side view of the capacitance manometer and its fitting mounted to the module of FIG. 2A and 2B.
Figure 3B:
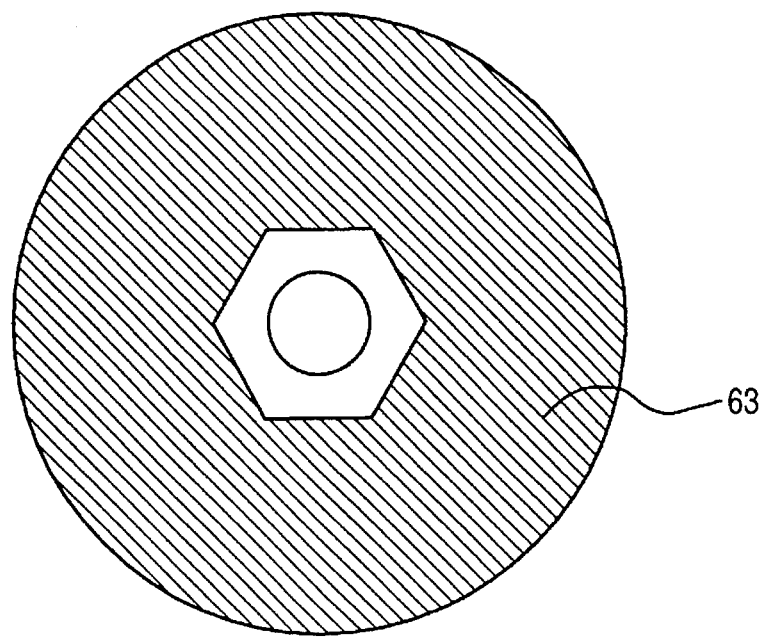
FIG. 3B is a bottom view of the manometer of FIG. 3A.

Because the valves 20, 21, which are intimately seated in the housing 41, and the manometer 19 mounted directly to the housing 41A, they are heated by conduction. This arrangement avoids heat sinks which may cause the undesirable condensation of the heated vapor from the reservoir 44. Furthermore, the manometer 19, and the manometer 18, are also designed so that they are efficiently heated. Typically these manometers have a shaft separating the sensing area of the manometer and its fitting. In the present invention the shaft is eliminated so that the sensing area of the manometer 19 is directly connected to the fitting 59 as shown in FIG. 3A and 3B. Two heating elements, one element 64A wrapped around the sensing area (shaded in FIG. 3A) of the cylindrically-shaped manometer 19 and the other element 64B attached to circularly-shaped sensing area 63 around the fitting 59 (seen in the bottom view of the manometer in FIG. 3B), heat the manometer 19. These heating elements are formed from heating foils embedded in silicon rubber insulation material. They are shaped as shown in FIG. 3C but are flexible so that the element 62A may be wrapped around the cover of the manometers 19 and 18. Such heating elements are manufactured by Watlow Electric of St. Louis, Mo.

As in many present day semiconductor processing equipment, the control unit 17 of FIG. 1 has a microprocessor, a 80386SX from Intel Corporation of Santa Clara, Calif., which controls the functions of the module 11 by well-known programming techniques. Furthermore, not all the electrical connections from the valves and sensors are shown in the drawings.

From the feedback signals of the manometer 18, the microprocessor controls the proportioning pressure valve 20 (and its heating) to maintain the processing chamber 39 at the desired pressure. The microprocessor also controls the temperature of the reservoir 44 through the heating rods 42 to maintain the vapor in the module 11 at a desired temperature and pressure, and controls the liquid resupply of the reservoir 44 through the refill valve 22 under the feedback control signals from the liquid level sensor 43. It should be noted that the control unit 17 can be connected to other sensors, as described below, to control the vapor flow from the module 11 into a processing chamber.

Figure 4:
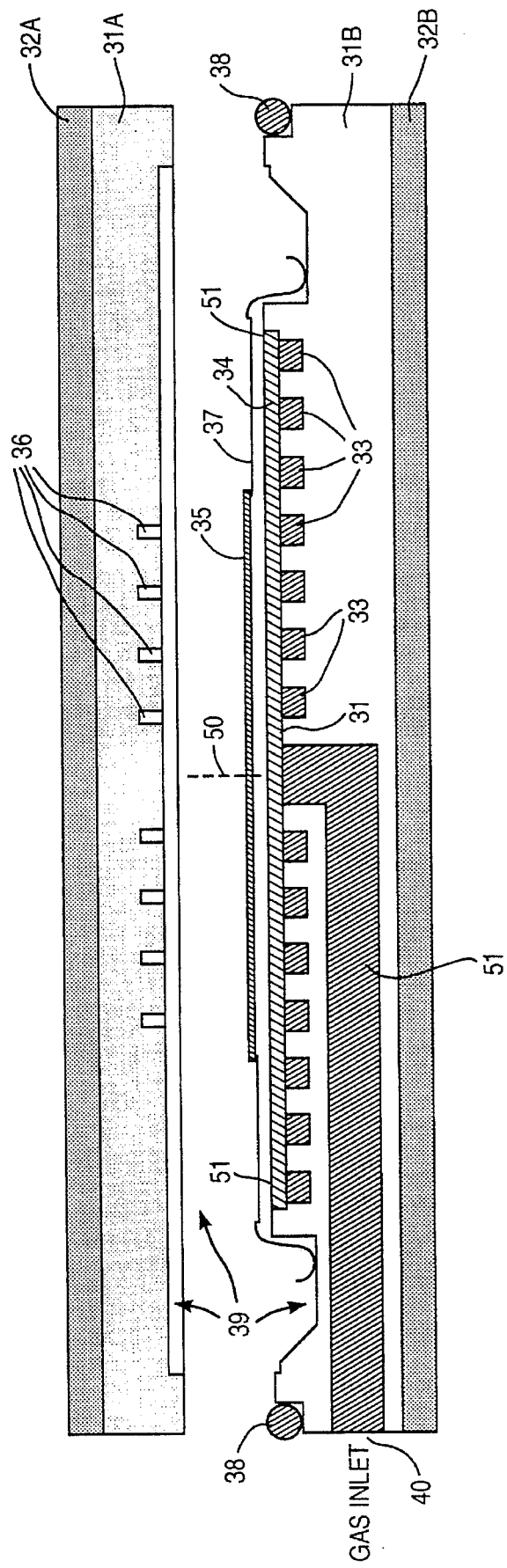
FIG. 4 is a side view of the processing chamber of the chemical vapor delivery system of FIG. 1.

FIG. 4 is a cross-sectional side view of a processing chamber 39 in the processing unit 10 of FIG. 1. The processing chamber 39 is generally shaped and sized to hold one semiconductor wafer 35. The chamber 39 is formed by a top housing plate 31A and bottom housing plate 31B. Typically these plates 31A and 31B are formed from stainless steel.

The processing chamber 39 is defined between the two housing plates 31A and 31B when clamped together. In the region where a semiconductor wafer is mounted for processing, the processing chamber has a height of 1 to 2 inches. The length (and width) of the chamber 39 is approximately 11 inches for 8-inch wafers, i.e., wafers having a 200 mm. diameter. Hence the total volume of the chamber 39 is small, approximately 5 to 10 cubic inches. A rubber bushing 38 around the upper edge of the lower housing plate 31*b* ensures that the processing chamber 39 is sealed when the plates 31A and 31B are clamped together during operation.

The top housing plate 31A has several gas channels 36 which are part of a vacuum chuck for the wafer in the processing chamber 39. The channels 36 are connected to a vacuum source to hold the wafer firmly in place for heat transfer during operation. A heater unit 32A is also mounted to the top of the housing 31A. This unit 32A is formed by resistance heating coils.

The bottom housing 31B has gas supply channels 33 which are all interconnected to a gas inlet 40 by a supply channel 51. The channels 33 form a circular pattern around a center axis 50 as explained below. Mounted to the bottom of the housing plate 31B is another heater unit 32B formed by resistance heating coils.

Figure 5:
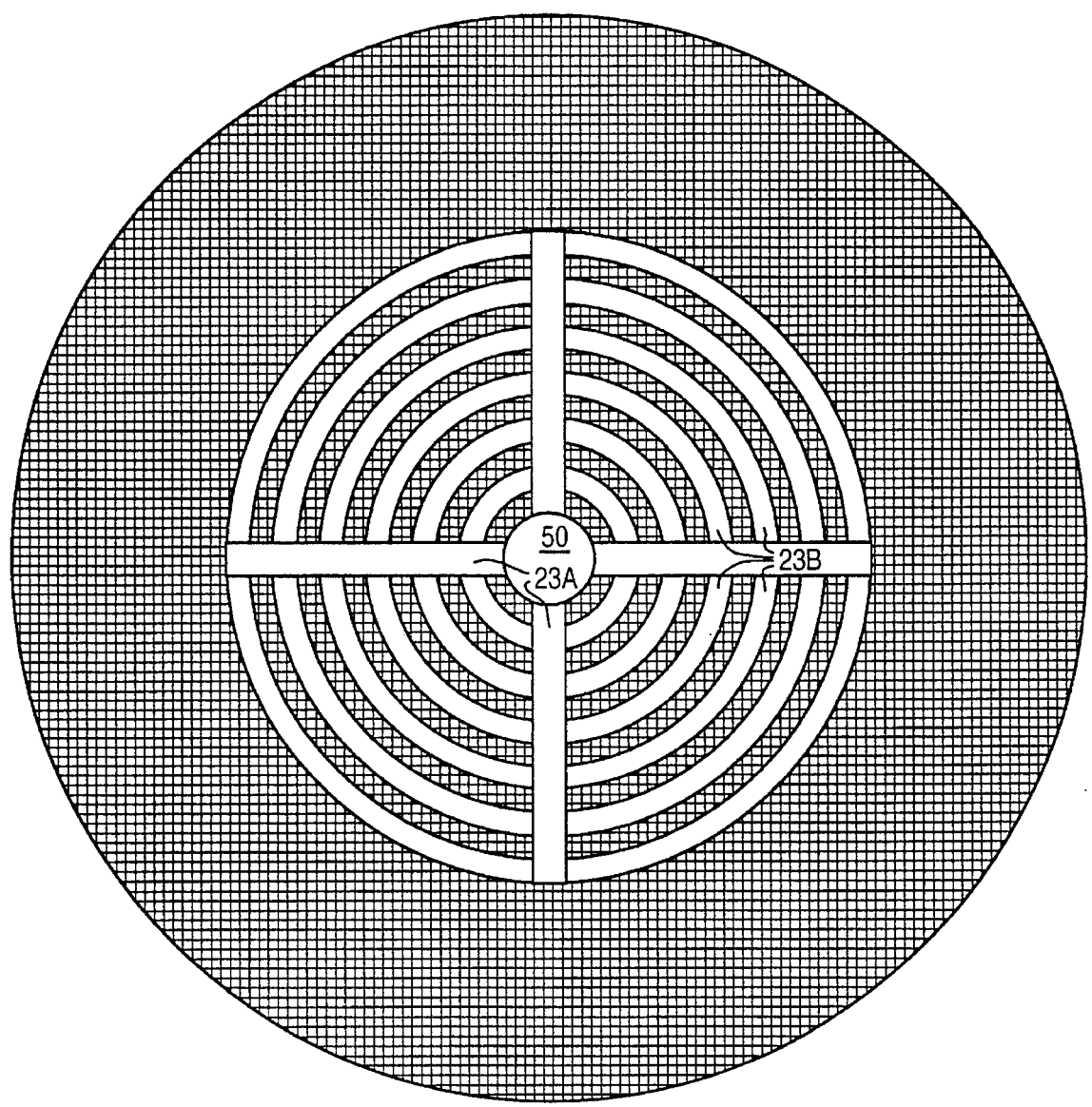
FIG. 5 illustrates a top view of the gas supply channels for the processing chamber of FIG. 2.

It is very important that any reactant gas be supplied uniformly to a semiconductor wafer during processing. Viewed from above as shown in FIG. 5, the open gas supply channels 33 are radially distributed in the lower housing plate 31B around the center axis 50. The channels 33 have four radial channels 33A from the center axis 50 which intersect evenly spaced circular channels 33B centered about the axis 50. During operation of the processing unit 10, the supplied vapor enters the gas inlet 40 from the outlet 62 of the module 11. Through the supply channel 51 the vapor enters the radial channels 33A from the center axis 50 and is distributed to the circular channels 33B.

For vaporized silylating agents, channels of cross-sections of approximately 0.25 inches deep X 0.40 inches wide for the radial channels 33A, and radial spacing of 1.0 inches for the circular channels 33B work very well in distributing the vapor.

Between the gas supply channels 33 and the chamber 39 there are two circular plates 34A and 34B which fit into a circular slot 51 over the open channels 33. In FIG. 4 the two plates 34A and 34B are shown as a single plate 34. The plates 34A and 34B perform a gas dispersion function. The plate 34A, which is placed directly over the channels 33, has numerous holes of 0.030 inch diameter drilled in a pattern favoring the outside, i.e., away from the center axis 50. In this manner the same amount of gas is delivered to a unit volume of the processing chamber 39. Typically, this plate is formed from stainless steel.

Above the first gas distribution plate 34A is the second gas dispersion plate 34B. The plate 34B disperses the gases from the channels 33 more finely than the plate 34A. The plate 34B is formed from pressed metal, stainless steel or porous graphite and has no visible holes. Nonetheless gas can pass through the plate 34B. Thus the incoming gas vapor from the channels 33 are distributed by the plate 34A and leak through the dispersion plate 34B into the processing chamber 39.

To hold a semiconductor wafer 35 in place in the chamber, a wafer holder 37 is used. During processing, the wafer 35A is placed facedown toward the gas distribution channels 33. Once the top housing plate 31A is closed, the wafer is held in place and in contact with the plate 31A by the vacuum channels 36.

Figure 6:
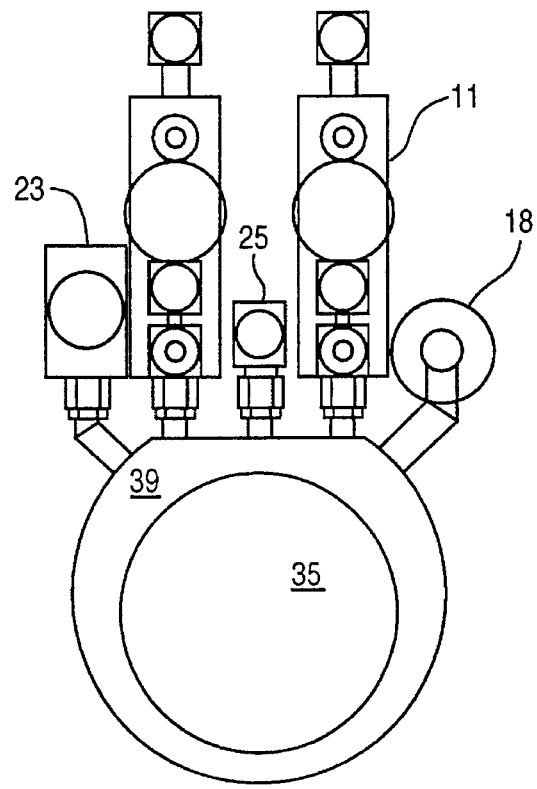
FIG. 6 illustrates in a vertical view how the module mounts to the processing unit in the chemical vapor delivery system of FIG. 1.

FIG. 6 is a top view of the processing chamber 39 with a wafer 35 and illustrates schematically how a module 11 is connected to the processing unit 10. The housing of the module 11 is bolted to the housing of the processing unit 10 so that the outlet 62 is connected tightly to the gas inlet 40 to the processing chamber.

The manometer 18 monitors the pressure in the processing chamber 39 with a wafer 35, an exhaust valve 23 removes the vapors from the chamber 39, and a valve 25 controls the nitrogen flow from the nitrogen supply 13. Furthermore, in this drawing the processing chamber 39 is connected to two modules 11. The two modules 11 are each connected to a different liquid supply so that multiple processes may be performed in the processing chamber 39.

In operation, the chemical vapor delivery system shown in FIG. 1 works very effectively with silylating agents, such as (hexamethyldisilazane) HMDS, (hexamethylcyclotrisilazane) HMCTS, (trimethylsilyldimethylamine) TMSDMA, (trimethylsilyldiethylamine) TMSDEA, (dimethylsilyldimethylamine) DMSDMA, (bis(dismethylsilyl)dimethylamine) B(DMS)DMA, and (bis(dimethylsilyl)methylamine) B(DMS)MA. The mass flow controller 11 heats the silylating agents to temperatures in the range of 25° to 200° C.

With the module 11 integrally mounted to the processing unit 10 and its processing chamber 39, a feed line is eliminated. Condensation is not a problem and the silylating agents can be delivered to the processing chamber 39 at precise temperatures and pressures. Among other benefits, the present invention avoids the complications resulting from the requirements of heating the feed line and maintaining it at a precise temperature, or connecting individual components together and having to heat each component.

Furthermore, the agents are distributed uniformly upon the wafer in the processing chamber 39.

Besides silylating agents, the present invention can be used for other liquid organosilanes and also other liquid sources used in etching and diffusion. One example is (tetraethyloxysilane) TEOS which is used for depositing silicate glass on a semiconductor wafer. TEOS vapor is delivered to the processing chamber 39 and semiconductor wafer at a much higher rate than the vapors of silylating agents. For example, typical flow rates for TEOS are 1 to 60 cc. per second, while silylating agent flow are 0.1 to 1 cc. per second. Hence the vapor flow rates in TEOS operations become more critical.

Figure 8:
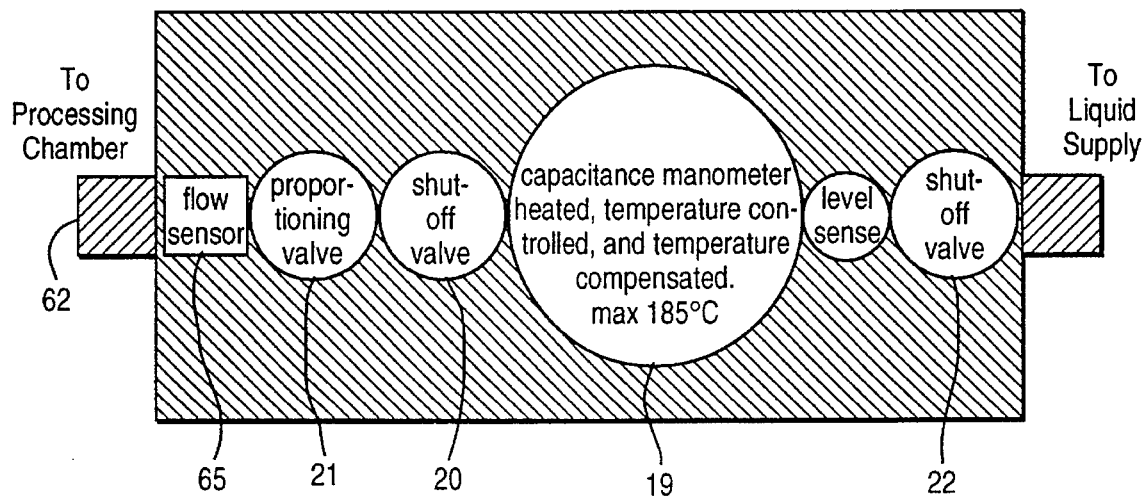
FIG. 8 schematically illustrates a modification of the module with a gas flow sensor according to the present invention.

For TEOS the module 11 is modified from operation as a pressure controller as described to a operation as a mass flow controller. The module 11 remains the same as described above with an added flow sensor 65 between the proportioning pressure valve 21 and the fitting and outlet 62, as shown symbolically in FIG. 8, to an gas supply inlet to a processing chamber. The control block 17 of FIG. 1 is modified. As before, the microprocessor in the unit 17 controls the temperature of the module 11, the temperature of the manometer 19, and the refilling operation of the reservoir 44. However, rather than the feedback signals from the manometer 18, the microprocessor also controls the flow of the vaporized TEOS with the proportioning pressure valve 21 in response to the feedback signals from the flow sensor 65.

However, as explained above, mass flow controllers (and their sensors) typically have difficulty operating at temperatures above 70 degrees C. In operation, the module 11 heats the reservoir 44 up to a maximum temperature of 185° C. to get the liquid TEOS into a vapor state. Other agents may require higher temperatures a better way of operation as a mass flow controller in addition to the manometer 19, a second manometer may be connected between the valve 21 and the outlet 62. With the microprocessor in the control unit 17, the flow from the reservoir 44 through the outlet 62 is calculated by the difference in pressure readings from the two manometers. Based upon the calculated value, the valve 21 is adjusted by a signal from the unit 17 to control the vapor flow.

Figure 7:
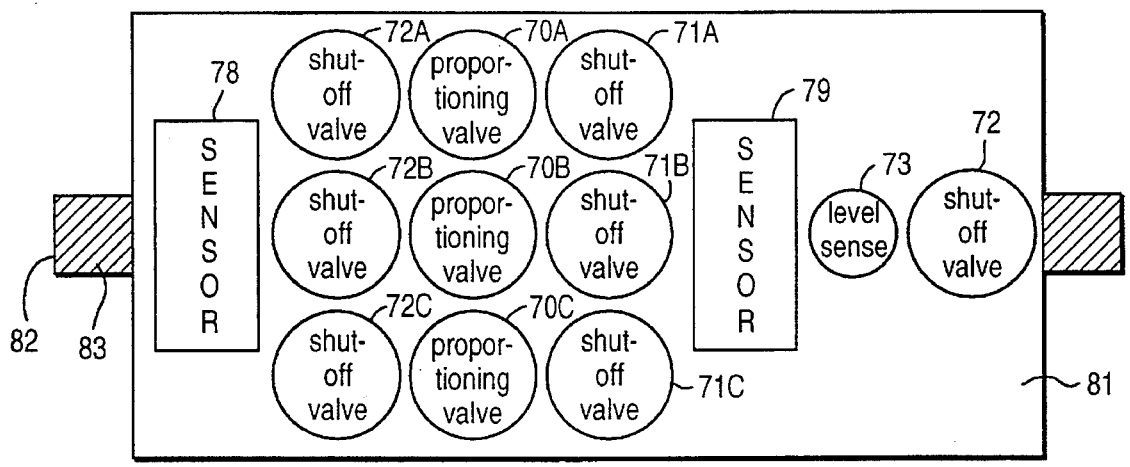
FIG. 7 schematically illustrates a modification of the module with three gas channels according to the present invention.

FIG. 7 illustrates a modification of the module 11 for an extended range of mass flow control. In the modification three gas channels are formed between the heated reservoir in the module and the gas outlet to a processing chamber. In FIG. 7 a shut-off valve 72 and level sensor 73 help control the level of the liquid in the reservoir in the modified module 81, as described previously. A capacitance manometer 79 measures the pressure at the reservoir. Connected to the reservoir are three gas channels, each formed by a proportioning pressure valve, 70A–70C, between two shut-off valves 71A–71C and 72A–72C and their respective fittings (not shown). The outlet of the fittings for the shut-off valves 72A–72C are connected to a second manometer 78 and its fitting (not shown), which in turn is connected to an outlet fitting 83 with an outlet 82 for a direct connection to an gas inlet to a processing chamber.

The shut-off valves 71A–71C and 72A–72C are operated to open one gas channel at a time for operation. Each channel has two shut-off valves to isolate each inoperative channel so that any backflow of the vapor into the channel is prevented.

The three gas channels permit three different flow ranges for the modified module. Typically a single channel under the control of the proportioning pressure valve can be operated so that the vapor flow can be operated over a decade, i.e., the flow rate can be varied from a flow unit to, say, 20 flow units. With the three channels, each of the proportioning pressure valves 70A–70C can be calibrated so that vapor flow operation can be extended over three decades or more. As described previously the two manometers provide the pressure differential to allow determination of flow rate of the selected channel. Note that the modified module need not be operated as a mass flow controller, but also a pressure controller with extended range of operation.

If the channels are operated at such disparate pressures that the manometers 78 and 79 cannot measure the pressures for all the operating conditions, then the module 81 may be modified so that a pair of manometers is placed on either side of a proportioning valve 70A–70C in each channel. The manometers are calibrated to operate under the conditions for each channel.

Another modification is the addition of a vent to a module operating as a mass flow controller. Located in the channel before the outlet is reached, a diverter valve controls the flow of vapor from the module's heated reservoir either through the outlet into the processing chamber or through the vent. Without the vent, the vapor flows into processing chamber as soon as the chamber feed valve 21 is opened. Under these initial conditions the rate of mass flow may not desirable. The vent and diverter valve permit the initial vapor flow rate through the vent to be stabilized and adjusted to the desired flow rate. Then the diverter valve is operated and the vapor flow shifted through the outlet of the module and into the processing chamber.

With this flexibility of operating conditions, the present invention can be used for many chemical processes having liquid sources. Carbon tetrachloride in etching processes may be used in the present invention and doping processes may be carried out by the present invention. The present invention may even handle chemical sources which are initially solid. The solid source may be heated itself so that the chemical solid is liquified so the chemical liquid can be sent to the integrated module of the present invention.

While the above is a complete description of the preferred embodiments of the invention, various alternatives, modifications and equivalents may be used. It should be evident that the present invention is equally applicable by making appropriate modifications to the embodiments described above. Therefore, the above description should not be taken as limiting the scope of the invention which is defined by metes and bounds of the appended claims.

What is claimed is:

1. A system for delivering chemical vapor from a liquid source for the processing of semiconductor wafers, comprising a processing unit having a housing defining a processing chamber for semiconductor wafers;

a gas inlet in said housing;

a plurality of gas supply channels in said housing connected to said gas inlet for supplying gas to said processing chamber;

a plurality of vacuum channels for removing gas from said processing chamber; and a module connected to a liquid source of chemical vapor and to said processing unit, said module having a housing mounted to said processing unit housing, said module housing defining a reservoir for receiving liquid from said liquid source;

means for heating said reservoir to form said chemical vapor from said liquid;

means connected to said gas inlet for delivering said chemical vapor to said gas inlet and said processing chamber;

whereby chemical vapor from said liquid source is delivered to said processing chamber for processing of said semiconductor wafers.

2. The chemical vapor delivering system as in claim 1 wherein said processing chamber is sized and shaped to hold one semiconductor wafer at a time, said semiconductor wafer being generally circular about a center axis and having two opposing major surfaces perpendicular to said center axis, and said gas supply channels open to said processing chamber and interconnected in a circular pattern about said center axis.

3. The chemical vapor delivering system as in claim 2 wherein said housing comprising a first housing plate and a second housing plate, said processing chamber defined between said first and second housing plates with said center axis perpendicular therewith, said gas inlet and gas supply channels in said first housing, said gas inlet connected to said gas supply channels along said center axis.

4. The chemical vapor delivering system as in claim 3 wherein said gas supply channels comprise a plurality of channels radiating from said center axis.

5. The chemical vapor delivering system as in claim 4 wherein said radiating channels have a semicircular cross-sections of approximately 0.25"×0.40".

6. The chemical vapor delivering system as in claim 4 wherein said gas supply channels comprise a plurality of circular channels about said center axis and intersecting said radiating channels.

7. The chemical vapor delivering system as in claim 6 wherein said circular channels are radially spaced approximately 0.75 inches from each other about said center axis.

8. The chemical vapor delivering system as in claim 6 wherein said circular channels have rectangular cross-sections with approximately 3 inch diameters.

9. The chemical vapor delivering system as in claim 4 further comprising a first plate over said gas supply channels, said first plate having a plurality of holes for dispersing gas into processing chamber from said gas supply channels.

10. The chemical vapor delivering system as in claim 9 further comprising a second plate over said first plate, said second plate being porous to gas for dispersing gas into processing chamber from said gas supply channels.

* * * * *